United States Patent
Higashitani

[11] Patent Number: 5,883,903
[45] Date of Patent: Mar. 16, 1999

[54] SEMICONDUCTOR MEMORY OF XN TYPE HAVING PARITY CORRESPONDING TO N× M BITS

[75] Inventor: Masaaki Higashitani, Kawasaki, Japan

[73] Assignee: Fujitsu Limited, Kawasaki, Japan

[21] Appl. No.: 748,532

[22] Filed: Nov. 13, 1996

Related U.S. Application Data

[63] Continuation-in-part of Ser. No. 588,693, Jan. 19, 1996, Pat. No. 5,671,239, which is a continuation of Ser. No. 307,421, Sep. 19, 1994, abandoned.

[30] Foreign Application Priority Data

| Sep. 20, 1993 | [JP] | Japan | 5-233956 |
| Nov. 10, 1993 | [JP] | Japan | 5-281436 |
| Dec. 28, 1995 | [JP] | Japan | 7-342267 |

[51] Int. Cl.$^6$ .................................................. G11C 29/00
[52] U.S. Cl. ........................................................ 371/10.2
[58] Field of Search .................................. 371/10.2, 10.3, 371/21.1, 40.1, 40.2, 49.1, 51.1; 395/182.05, 182.04; 365/200; 364/738

[56] References Cited

U.S. PATENT DOCUMENTS

| 4,748,627 | 5/1988 | Ohsawa | 371/38 |
| 4,901,320 | 2/1990 | Sawada et al. | 371/51.1 |
| 5,140,597 | 8/1992 | Araki | 371/51.1 |
| 5,199,033 | 3/1993 | McGeoch et al. | 371/10.1 |
| 5,418,796 | 5/1995 | Price et al. | 371/39.1 |
| 5,537,425 | 7/1996 | Tsou | 371/51.1 |
| 5,663,969 | 9/1997 | Tsou | 371/51.1 |
| 5,671,239 | 9/1997 | Higashitani et al. | 371/51.1 |
| 5,701,270 | 5/1994 | Rao | 365/230.03 |

Primary Examiner—Robert W. Beausoliel, Jr.
Assistant Examiner—Stephen C. Elmore
Attorney, Agent, or Firm—Nikaido, Marmelstein, Murray & Oram LLP

[57] ABSTRACT

A storage unit has m segments each having a plurality of storage areas each storing data of n-bit. One of the plurality of storage areas in each segment is selected by a storage area selection signal. A buffer memory has an (n×m)-bit storage area for storing n-bit for each of the m segments of the storage unit. Data is adapted to be transferred between the storage area of each segment and a corresponding storage area of the buffer memory. A parity storage unit has a storage area for storing one parity per the (n×m)-bit data stored in the buffer memory. A data correction unit corrects data in accordance with a parity stored in the parity storage unit and the (n×m)-bit data read from the m storage areas each selected from each of the m segments of the storage unit.

8 Claims, 10 Drawing Sheets

SEMICONDUCTOR MEMORY OF XN TYPE HAVING PARITY CORRESPONDING TO N× M BITS

CROSS REFERENCE TO RELATED APPLICATION

This application is a continuation-in-part application of a U.S. patent application, Ser. No. 08/588,693 filed on Jan. 19, 1996, now U.S. Pat. No. 5,671,239 which is a continuation application of a U.S. patent application, Ser. No. 08/307,421, filed on Sep. 19, 1994, now abandoned.

BACKGROUND OF THE INVENTION a). Field of the Invention

The present invention relates to a semiconductor memory, particularly a flash type semiconductor memory and a mask ROM type semiconductor memory.

b). Description of the Related Art

Demands for a high capacity semiconductor memory are increasing nowadays. Such demands are eminent particularly for a flash memory which can electrically erase the contents of stored data while keeping a large capacity specific to EPROM and is expected to become a substitute for a magnetic disk or other large capacity storage devices.

Like an EPROM, a flash memory writes data by injecting hot electrons into a floating gate, and erases the data by removing electric charges stored in the floating gate in the form of a tunnel current. In an erase operation, data "1" is written in all memory cells and then the data in all the cells are erased.

In a NOR type flash memory, data "0" and "1" are stored in correspondence with two threshold values HVth and LVth of an enhancement type MOS transistor. If electric charges are stored in the floating gate between the control gate and the channel, this state represents "1", whereas if not, it represents "0". Two threshold values HVth and LVth are, for example, about 7 V and 3 V.

Under the condition that 0 V is applied to the source, 1 V is applied to the drain, and 5 V is applied to the control gate, if the threshold value is high HVth, then the channel is not on, whereas if the threshold value is low LVth, then the channel is on. From this difference, data in the memory cell can be read. In a non-selected memory cell, the drain is made to be in a floating state, and the control gate is applied with 0 V.

If data "1" is to be written in a selected memory cell, the drain is applied with 6 V, and the control gate is applied with 12 V. In this case, electrons become hot electrons which tunnel through the oxide film over the channel and are injected into the floating gate to write data "1".

In an erase operation, data "1" is written in all cells, and thereafter, 0 V is applied to the control gates of all the cells and 12 V is applied to the sources, while making the drains be in a floating state. In this case, electrons stored in floating gates tunnel through oxide films to the sources.

In a memory cell array, control gates on the same row are connected to the same word line, and drains on the same column are connected to the same bit line.

Consider now that two word lines of such a flash memory are short-circuited. If an erase operation is performed in such a case, cells having a threshold value other than the predetermined value are generated. Specifically, even if 12 V is applied to one word line connected to the memory cell storing data "0", the other word line is applied with 0 V.

Therefore, the voltage of the word lines cannot take a sufficiently high value, and the memory cells connected to the short-circuited word lines take an insufficient write state.

Next, 0 V and 12 V are applied to all word lines (control gates) and sources, respectively, in order to erase the contents of all cells. Electrons in the floating gates of the memory cells in the insufficient write state are taken out excessively, and the floating gates are positively charged. This is called an over erase.

If data "1" is written in a memory cell in an over erase state, an insufficient write state occurs because the initial level of the threshold value is not 0 but a positive potential (negative storage) and a sufficient voltage cannot be applied to the word line due to the short-circuiting. As described above, data cannot be written to all memory cells connected to the short-circuited word lines.

It is meaningless to use redundant cells on short-circuited word lines. Redundant cells are therefore connected to bit lines (on the column side).

If there is a memory cell in an over erase state, other cells connected to the same bit line are also unable to read data.

If a memory cell transistor has a negative threshold value because of an over erase, a current flows through the bit line even if the transistor is not selected and 0 V is applied. As a result, if a memory cell from which data is read is connected to the same bit line as such a memory cell with a negative threshold value, a current flows through the bit Line, irrespective of the threshold value of the cell.

Another approach to a redundancy operation for a flash memory is to use a redundant cell block. With this approach, a memory is divided into a plurality of blocks, and if there is a defective block, it is replaced by a redundant block. In this case, when an address decoded by an address decoder indicates the defective block, this address is translated into an address of the redundant block.

As described above, an appropriate redundancy scheme has been desired which can deal with a defect of a flash memory.

In the case of a mask ROM type semiconductor memory, data is written at the time of manufacture. Since the cell data cannot be changed after the manufacture, a yield has lowered as integration and capacity of the cell array has become high. It is therefore desired to improve the manufacturing yield.

As redundant cells for a conventional mask ROM type semiconductor memory, for example, a programmable ROM such as EPROM is additionally used in the memory cell array.

If a defective cell is found in a semiconductor memory by an operation test after manufacture, the address and data of the defective cell are written in a programmable ROM.

When an address of the defective cell is designated during a cell data read operation, the cell data written in the programmable ROM is automatically read.

A redundant cell unit of such a programmable ROM is generally larger than a mask ROM cell unit, resulting in a large chip area of the memory cell array.

Furthermore, a high voltage and a long work time is required for writing the address and data of a defective cell in the programmable ROM.

A mask ROM described in Japanese Patent Laid-open Publication No. 2-203500 enables a redundancy operation without using a programmable ROM.

This mask ROM type memory cell array has a parity unit for storing parity data representing a sum of all data of memory cells at each row.

Using the parity data, a parity check circuit generates a correction bit "1" if there is a parity error and a correction bit "0" if not. In accordance with the correction bit, a data correction circuit corrects output data.

With this method, a parity in addition to data is written. It takes time to write and check parity data for each memory cell.

SUMMARY OF THE INVENTION

It is an object of the present invention to provide a novel redundancy scheme for a flash memory.

It is another object of the present invention to provide a mask ROM capable of performing a redundancy operation for a defective cell readily and speedily while suppressing a chip area increase.

According to one aspect of the present invention, there is provided a semiconductor memory device comprising: storage means having m (m is an integer of 2 or larger) segments each having a plurality of storage areas each storing data of n-bit (n is a natural number), one of the plurality of storage areas in each segment being selected by a storage area selection signal externally input; a buffer memory having an (n×m)-bit storage area for storing n-bit for each of the m segments of the storage means, data being adapted to be transferred between the storage area of each segment and a corresponding storage area of the buffer memory; parity storage means having a storage area, corresponding to the storage area of each segment of the storage means, for storing one parity per (n×m)-bit data stored in m storage areas each selected from each of the m segments of the storage means; and data correction means for correcting data in accordance with a parity stored in the parity storage means and the (n×m)-bit data read from the m storage areas each selected from each of the m segments of the storage means.

In reading data from a storage area of one segment, not only the data of the one segment to be read but also data in the other corresponding storage areas among the m segments are read and transferred to the buffer memory. The data is corrected in accordance with the data transferred to the buffer memory and the parity stored in the parity storage means. Of the corrected data, only the data of the one segment to be read is output.

According to another aspect of the present invention, there is provided the semiconductor memory device further comprising: input/output control means for transferring data between an external circuit and the storage area of n-bit corresponding to a segment identified by an input segment selection signal among the (n×m)-bit storage area of the buffer memory.

The input/output control means outputs only the data corresponding to the segment to be read, among the data stored in the buffer memory.

According to another aspect of the present invention, there is provided the semiconductor memory device wherein the storage means includes n×m cell blocks each having a plurality of cells each storing one-bit data, each cell block corresponding to one bit of the buffer memory, and one cell in each cell block being identified by the storage area selection signal.

One segment is constituted by n cell blocks. Of one-bit data stored in each cell block, the data in the cell identified by the storage area selection signal is transferred to the corresponding bit of the buffer memory.

According to another aspect of the present invention, there is provided the semiconductor memory device wherein the data correction means includes defective cell block storage means for storing a defective block data, if there is any defective cell block among the n×m cell blocks, the defective block data indicating the defective cell block.

According to another aspect of the present invention, there is provided the semiconductor memory device wherein the data correction means reproduces data of the defective cell block in accordance with the parity stored in the parity storage means and (n×m−1)-bit data excepting the bit corresponding to the defective cell block indicated by the defective cell block storage means among the (n×m)-bit data stored in the buffer memory.

According to another aspect of the present invention, there is provided the semiconductor memory device further comprising: parity generating means for generating a parity in accordance with the (n×m)-bit data stored in the buffer memory and write the generated parity into the parity storage means.

Write data is temporarily stored in the buffer memory, and a parity is generated in accordance with the data stored in the buffer memory. Since the data in a plurality of segments is stored in the buffer memory at the same time, one parity for the data in a plurality of segments can be generated.

DETAILED DESCRIPTION OF THE PREFERRED EMBODIMENTS

Figure 1:
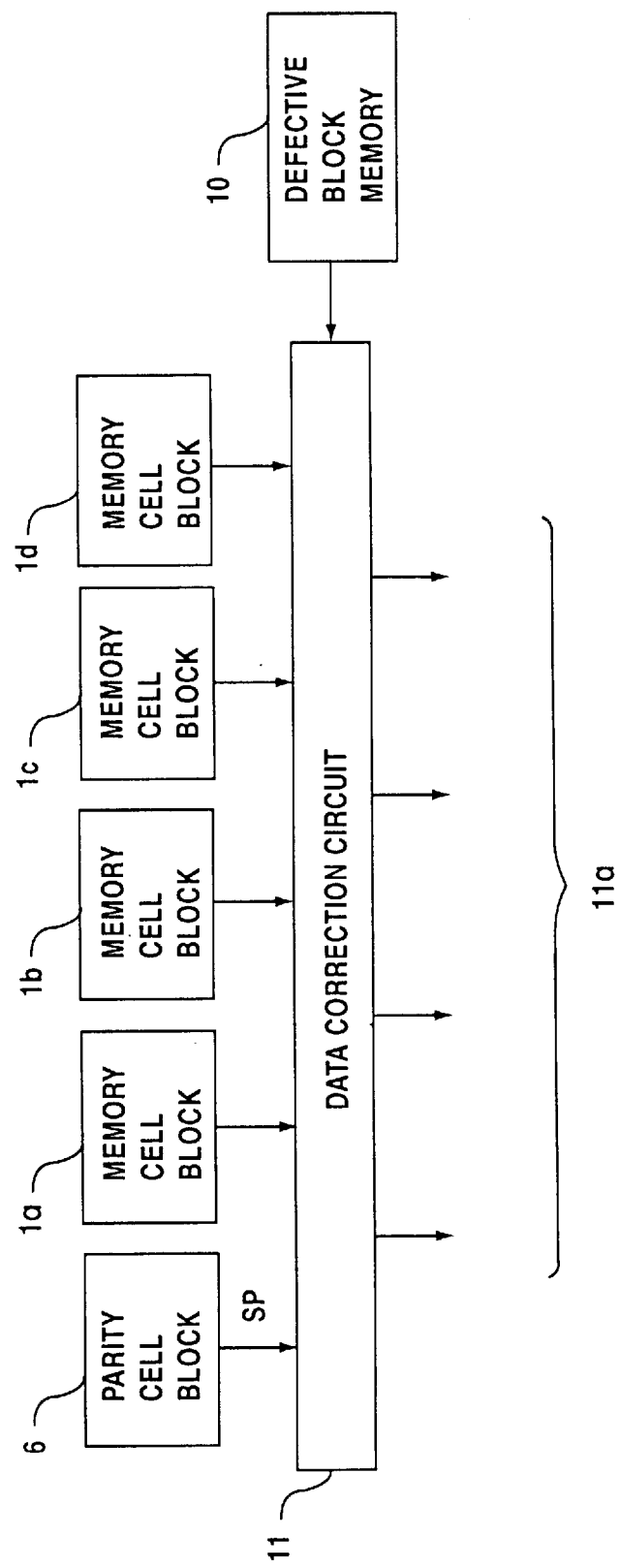
FIG. 1 is a block diagram showing a memory device according to a fundamental embodiment of the invention.

FIG. 1 is a block diagram showing the structure of a semiconductor memory device according to a fundamental embodiment of the invention.

The semiconductor memory device has a mask ROM type memory array of a multi-bit structure constructed of a plurality memory cell blocks 1 each having the same address space, a parity cell block 6, a defective block memory unit 10, and a data correction circuit 11.

An Exclusive OR (EOR) value of data of the memory cell blocks 1a to 1d at the same address is stored as parity data SP in the parity cell block 6 at the corresponding same address. The defective block memory unit 10 stores the defective block data indicating a defective memory cell block 1. The data correction circuit 11 corrects one-bit error data in multi-bit cell data in accordance with the parity data SP stored in the parity cell block 6, the defective block data stored in the defective block memory unit 10, and the multi-bit cell data read from normal memory cell blocks 1. The data correction circuit 11 then outputs correct multi-bit data 11a.

If all memory cell blocks are normal, the defective block memory unit 10 does not output a signal and the data correction circuit 6 outputs data received from the cell blocks 1a to 1d.

If a memory cell block among any cell blocks is abnormal or defective, the defective block memory unit 10 outputs the defective block data indicating the defective memory cell. The data correction circuit 11 generates original correct data of the defective memory cell in the cell block, by using the parity data SP and data from the correct cell blocks, and outputs correct multi-bit data.

Correct data can be generated by a process of replacing error data by a predetermined signal and executing an Exclusive OR (EOR) operation.

The parity cell block 6 stores parities of data stored in a plurality of cell blocks at the same address. In the case of a flash memory, a parity signal is generated by an EOR operation of write data, and stored in the parity cell block 6. In the case of a mask ROM, data and parities to be written at a manufacture process are known, and they are written in the memory cell blocks and parity cell block at the time of manufacture.

There is no essential difference of data read between a flash memory and a mask ROM.

Figure 2:
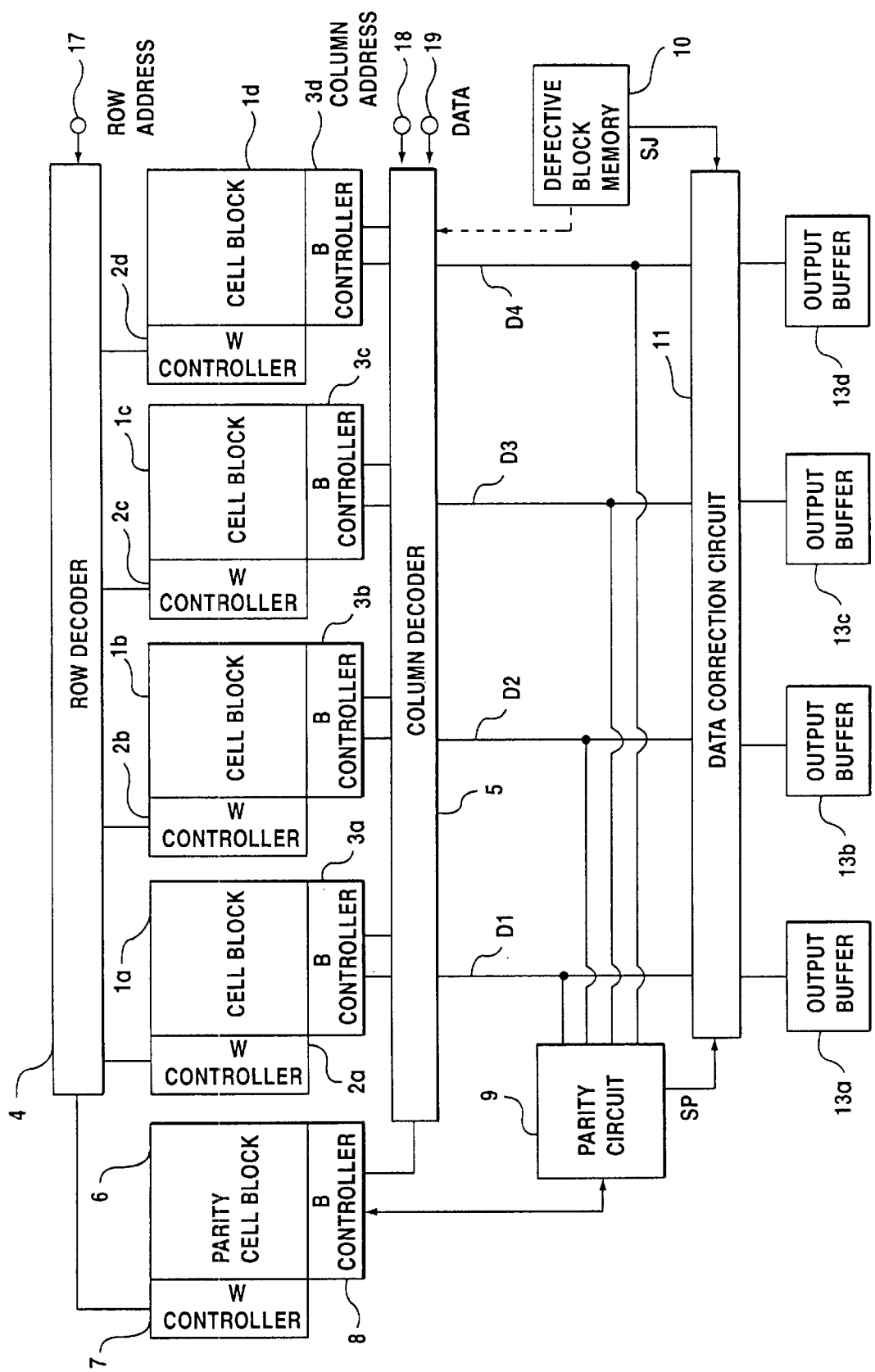
FIG. 2 is a circuit block diagram showing the structure of a flash memory according to an embodiment of the invention.

FIG. 2 is a circuit block diagram of a flash memory according to an embodiment of the invention. Memory cell blocks 1a, 1b, . . . store n-bit data and have cells disposed in a matrix. In this embodiment, four memory cell blocks (n=4) are used each having a word controller 2 for controlling word lines and a bit controller 3 for controlling bit lines.

Figure 3:
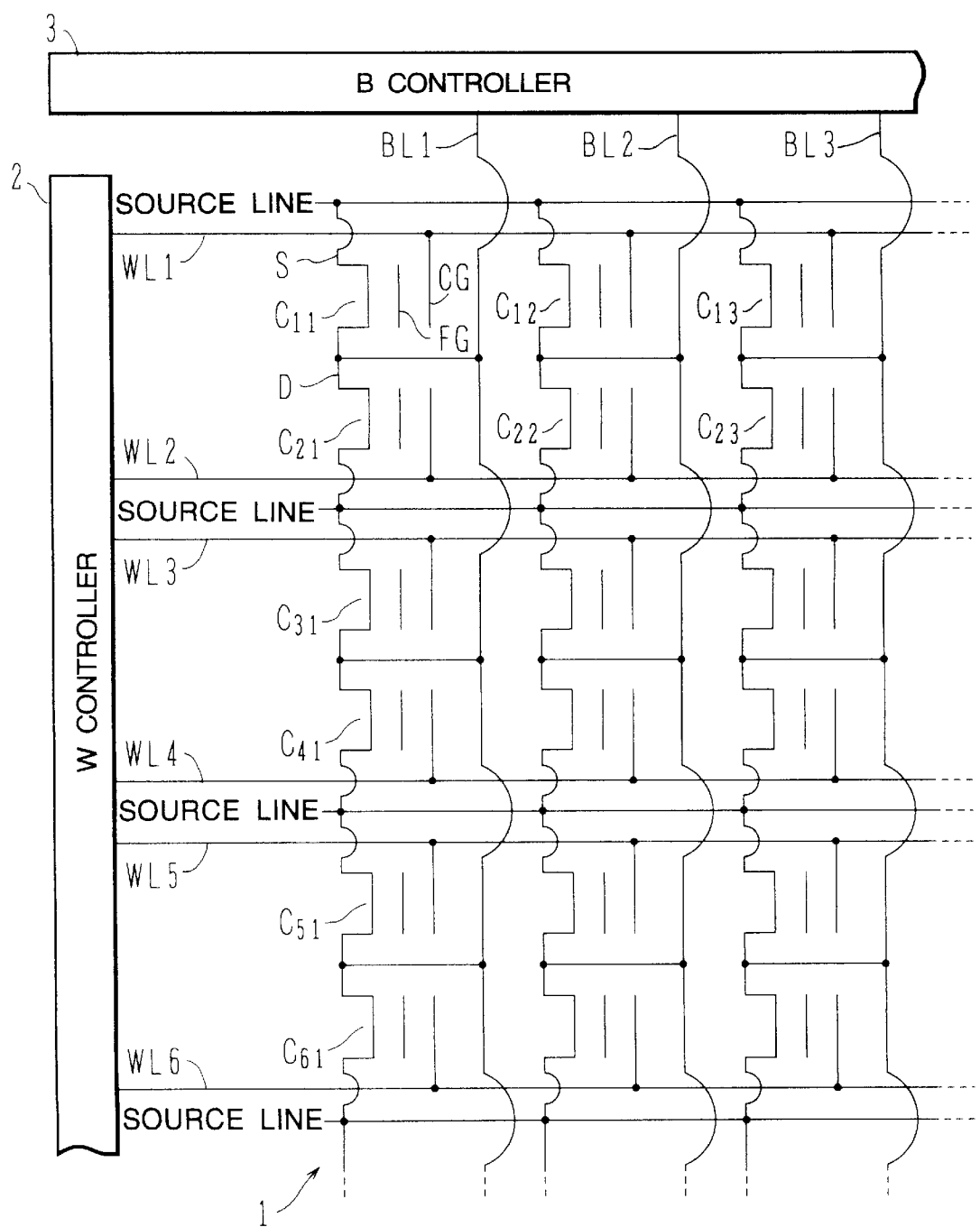
FIG. 3 is a circuit diagram of a cell block of the flash memory shown in FIG. 2.

FIG. 3 shows the detailed structure of the memory cell block 1. The memory cell block 1 has a number of non-volatile memory cells Cij of a floating gate type transistor disposed in a matrix.

This memory cell block 1 will be described by taking a memory cell C11 as an example. The source S of a MOS transistor having a floating gate FG is connected to a source line, and the drain D thereof is connected to a bit line BL1. A control gate CG formed over the floating gate FG is connected to a word line WL1.

Data read/write of this memory cell C11 is performed by controlling voltages to be applied to the bit line BL1 and word line WL1. The control gates CG of memory cells disposed at each row are connected in common to the same word line WL, whereas the drains D disposed at each column are connected in common to the same bit line BL. Each word line WL is controlled by the word controller 2, and each bit line BL is controlled by the bit controller 3.

Figure 4:
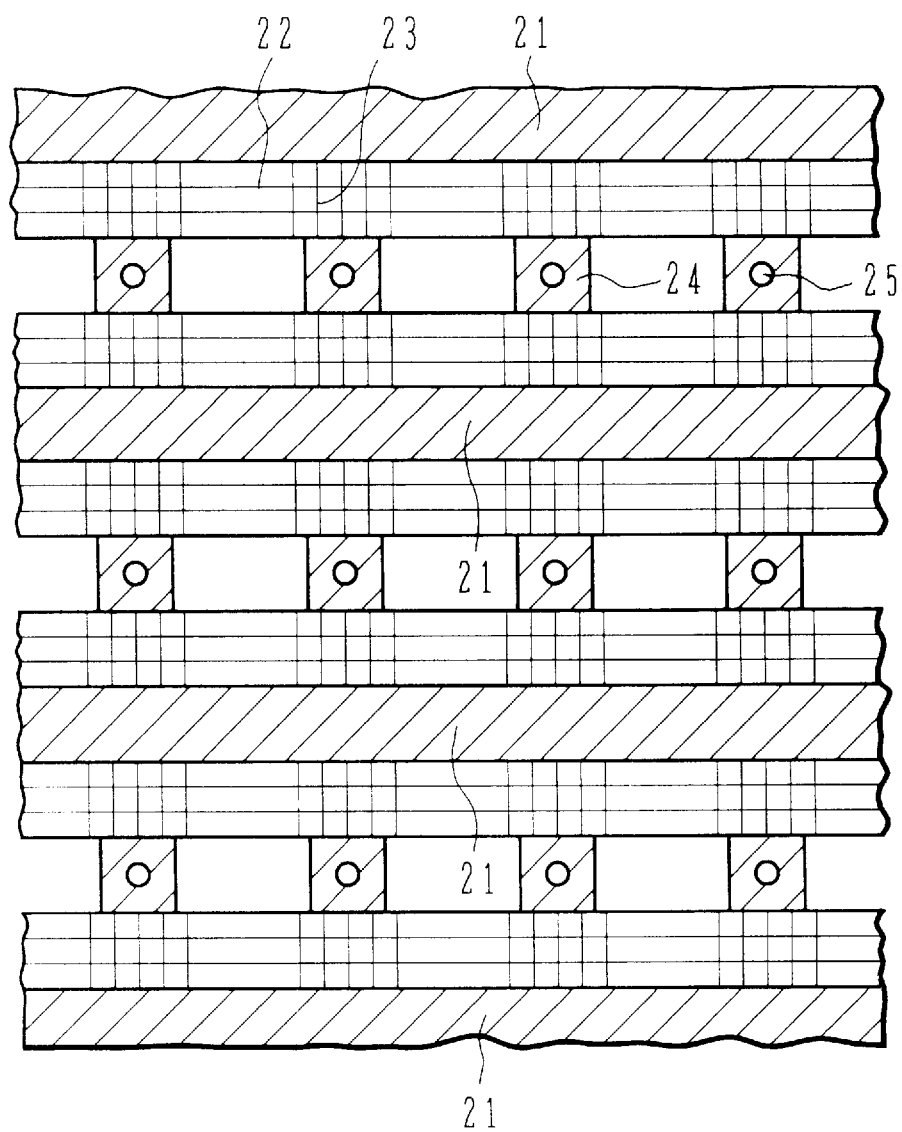
FIG. 4 is a schematic plan view showing the layout of a semiconductor chip of the cell block shown in FIG. 3.

FIG. 4 is a schematic plan view showing the layout of the memory cell block shown in FIG. 3. A plurality of source regions (source lines) 21 continuous in the horizontal direction in FIG. 4 are disposed in the column direction. A number of non-volatile memory cells are connected between two consecutive source regions 21. Each drain region 24 is used in common by two non-volatile memory cells formed between upper and lower source lines 21.

A floating gate electrode 23 in an electrically floating state is disposed over a channel region formed between the source line 21 and drain region 24, a control electrode (word line) 21 being formed over the floating gate electrode 23 extending in the horizontal direction in FIG. 4. A bit line (not shown) is disposed in the vertical direction in FIG. 4 and connected via a bit contact hole 25 to the drain region 24.

In the structure shown in FIG. 4, a memory cell matrix has word lines disposed in the horizontal direction and bit lines disposed in the vertical direction. A source line is disposed in parallel with the word line.

Referring back to FIG. 2, the word controller 2 of each cell block 1 is connected to and controlled by a row decoder 4. The bit controller 3 is connected to and controlled by a column decoder 5, and transfers data to and from the memory cell block 1. The row decoder 4 receives a row address signal from a terminal 17, and the column decoder 5 receives a column address signal from a terminal 18. Data is supplied from a terminal 19.

A parity cell block 6 having the same structure as the memory cell block 1 is connected in parallel with the memory cell blocks 1. The parity cell block 6 has a word controller 7 for controlling its word lines and a bit controller 8 for controlling its bit lines, the controllers 7 and 8 being connected to the row decoder 4 and column decoder 5.

Figure 5:
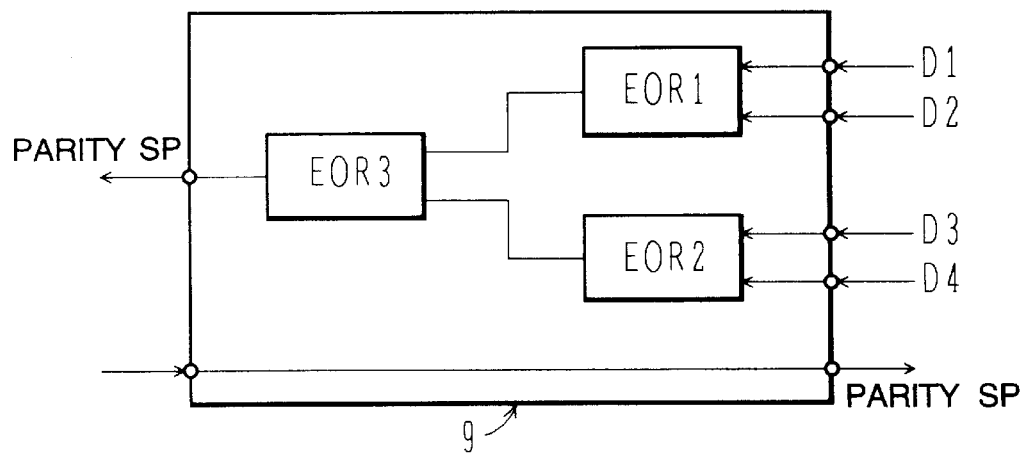
FIG. 5 is a block diagram showing the structure of a parity circuit of one embodiment.

The parity circuit 9 receives n-bit data on data lines D1 to D4 and calculates a parity for the n-bit data. The parity circuit 9 has a structure such as shown in FIG. 5. An EOR of in data D1 to D4 is calculated by EOR gates EOR1 to EOR3, and the EOR is output as a parity SP. This parity signal SP from the parity circuit 9 is supplied via the bit controller 8 to the parity cell block 6 and stored therein.

The defective block memory unit 10 stores the address of a defective block 1 if any. The defective block memory unit 10 is required to have a function of storing the address of a defective cell block and preferably of further storing the defective address in the block, and it may be made of fuses. The defective block memory unit 10 supplies its output signal to the data correction circuit 11, or in some case the signal may be supplied also to the column decoder 5. The data correction circuit 11 is connected to the data lines D1 to D4 from the cell blocks 1a to 1d and to the parity circuit 9. In a data read operation, the data correction circuit 11 receives the data D1 to D4 from the cell blocks 1a to 1d and the parity signal SP from the parity circuit 9. If a read address coincides with the defective block address stored in the defective block memory unit 10, a signal SJ representative of the defective block is output from the defective block memory unit 10 to the data correction circuit 11. In thls case, data from the defective cell block is not used, but data read from the other cell blocks and the parity signal supplied from the parity cell block are used to generate correct data. Correct multi-bit data is then supplied to output buffers 13.

Figure 6:
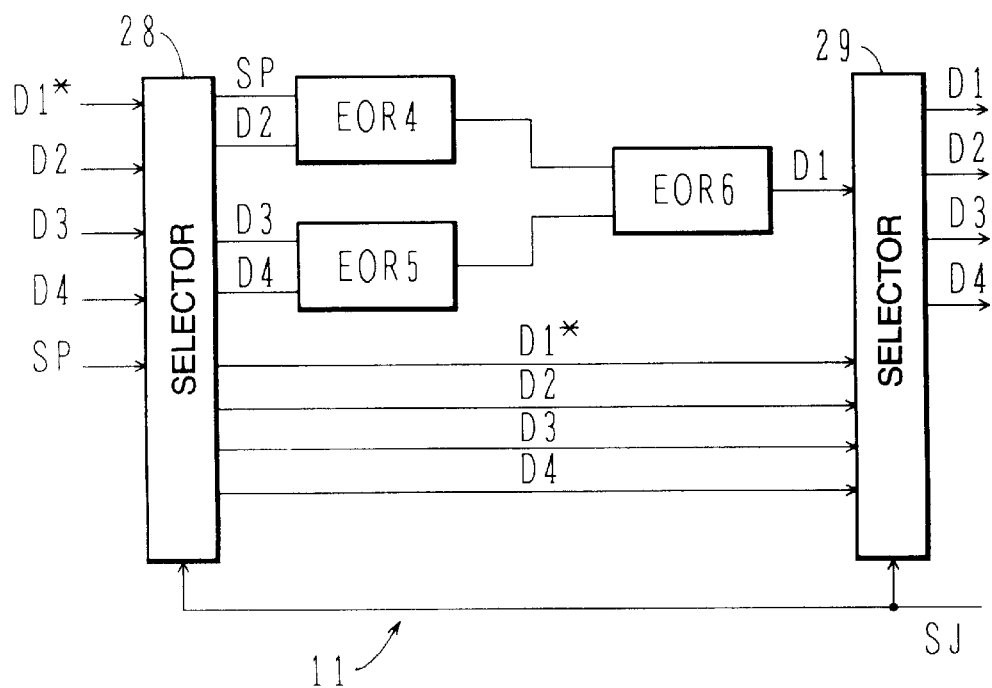
FIG. 6 is a block diagram showing the structure of a data correction circuit of one embodiment.

FIG. 6 shows an example of the structure of the data correction circuit 11. A selector 28 receives outputs D1 to D4 from the four memory cell blocks 1a to 1d, a parity bit SP supplied from the parity cell block 6 via the parity circuit 9, and a signal SJ identifying the error data supplied from the defective block memory unit 10, and supplies three correct data excepting the error data and parity signal to two EOR gates EOR4 and EOR5. In an example shown in FIG. 6, D1 is assumed to be error data. Outputs of EOR4 and EOR5 are supplied to EOR6 which supplies an EOR of three correct data and the parity to another selector 29. The selector 29 receives original four data D1 to D4, corrected data, and defective block identifying signal SJ, and outputs correct data D1 to D4.

For example, it is assumed that under the condition that the correct data is (1 1 0 0) and the parity is "0", the memory block 1a is defective and outputs "0". In this case, EOR4 outputs an EOR "1" of the parity 0 and D2=1, and EOR5 outputs an EOR "0" of D3=0 and D4=0. EOR6 outputs an EOR "1" of "1" and "0". In this manner, the correct data D1=1 is recovered.

As described above, a block redundancy operation can be performed by using parities stored in the parity cell block, without using a conventional redundant cell block. The operation of the embodiment will further be detailed by taking four cell blocks as an example.

A cell address is designated by a cell block address, a row address, and a column address. It is assumed that the cell block 1a is defective and that data (1 1 0 0) is to be stored in the cell blocks 1a to 1d at the same address (1 1).

Data (1 1 0 0) is supplied from the terminal 19 to the data lines D1 to D4. The parity circuit 9 generates a parity "0" from the supplied data (1 1 0 0), and stores it in the parity cell block 6 at the address (1 1).

In a store operation, data (1 1 0 0) is stored in the cell blocks 1a to 1d. When the cell block 1a is defective, however, the defective cell block 1a stores its data "1" erroneously.

In a read operation, the data is read from the cell blocks 1a to 1d and supplied via the data lines D1 to D4 to the data correction circuit 11. The parity data SP read from the parity cell block 6 via the parity circuit 9 is also supplied to the data correction circuit 11. In addition to the data from the cell blocks 1 and the parity data SP from the parity cell block 6, the data correction circuit 11 also receives the defective block identifying signal SJ indicating the defective cell block 1a from the defective block memory unit 10.

Since data and parity are stored in the memory cell blocks and parity cell block at the same address, the signal SJ is sufficient if it identifies the defective block, without identifying a defective memory cell address in each memory cell block.

The data correction circuit 11 generates correct data D1 of the cell block 1a at the address (1 1), by using the data D2 to D4 in the normal cell blocks 1b to 1d and the parity signal SP, and supplies correct data D1 to D4 to the output buffers 13a to 13d. In the above manner, even if a defective cell block is present, proper data read/write is ensured.

The defective block memory unit 10 may be used with the column decoder 5 in order not to write data in a defective cell block during a data write operation. In an erase operation, data in all cells of the cell blocks 1a to 1d and parity block 6 are erased at the same time. Although the above embodiment uses a 4-bit structure, it is apparent to those skilled in the art that other structures such as 8-bit, 16-bit structures may also be used.

With the above structure, address translation is not necessary even if a defective cell block is present. The flash memory constructed as above can be operated as if all cell blocks are normal, by using the parity cell block 6 and its controllers 7 and 8, parity circuit 9, defective block memory unit 10, and data correction circuit 11.

Other modifications are possible. For example, a single parity may be provided for each set of 2×n-bit structure if data read/write is performed in units of 2×n-bits.

In the flash memory described above, it is necessary to calculate and store a parity each time new data is written so as to generate correct data. In a mask ROM, data to be stored is programmed on a mask and written in a semiconductor chip as fixed data. Therefore, parities are also written as fixed data. A defective memory cell is detected only at a test after manufacturing it. Error data is corrected by using defective memory cell information and a parity.

Figure 7:
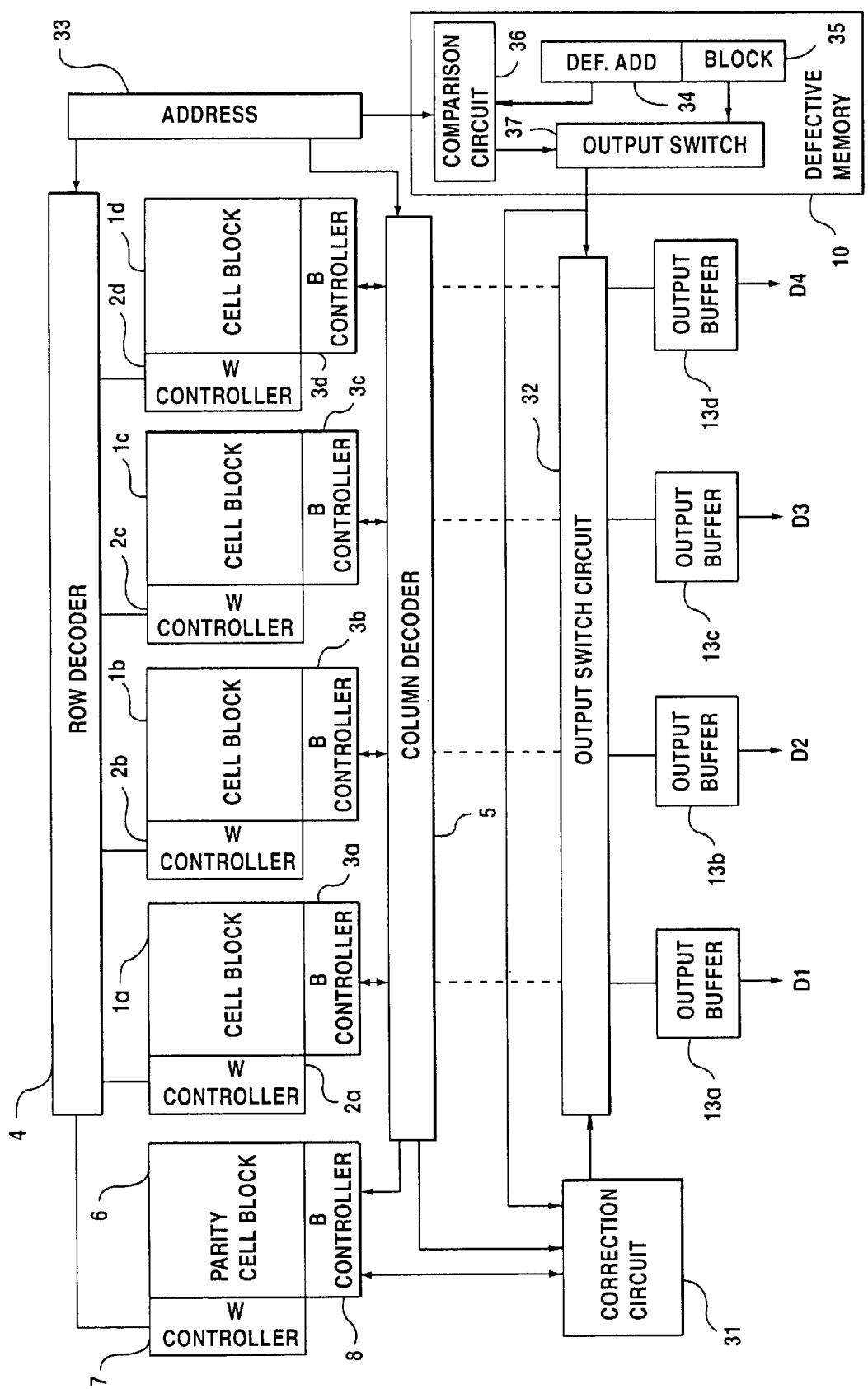
FIG. 7 is a block diagram showing the structure of a read-only memory according to another embodiment of the invention.

FIG. 7 shows an embodiment of a mask ROM of a 4-bit structure. Memory cell blocks 1a to 1d are a mask ROM of a multi-bit structure. A parity cell block 6 is also a mask ROM having the same structure.

Figure 8A:
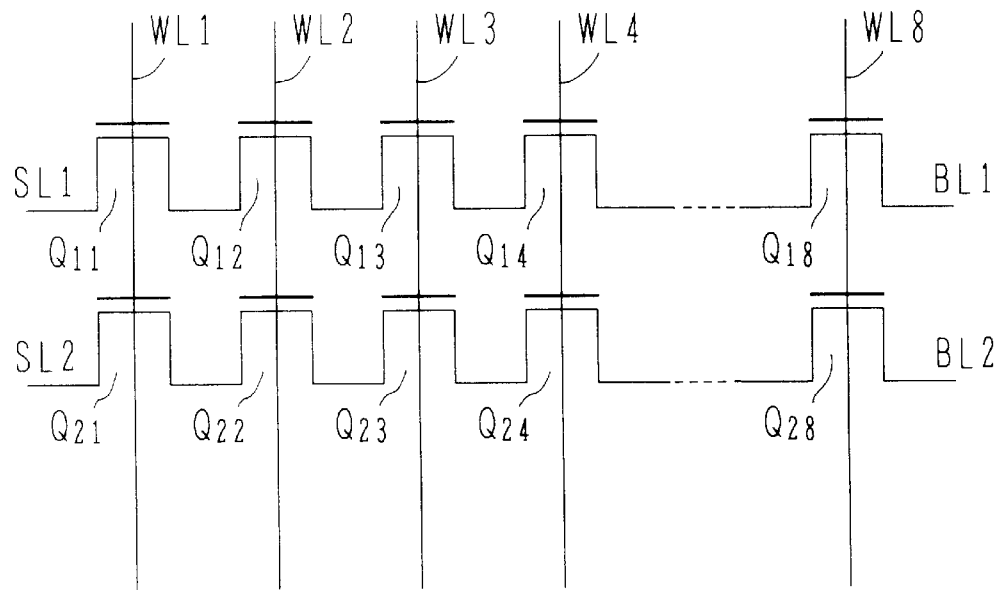
FIGS. 8A and 8B are circuit diagrams showing the structure of a ROM memory cell block of one embodiment.
Figure 8B:
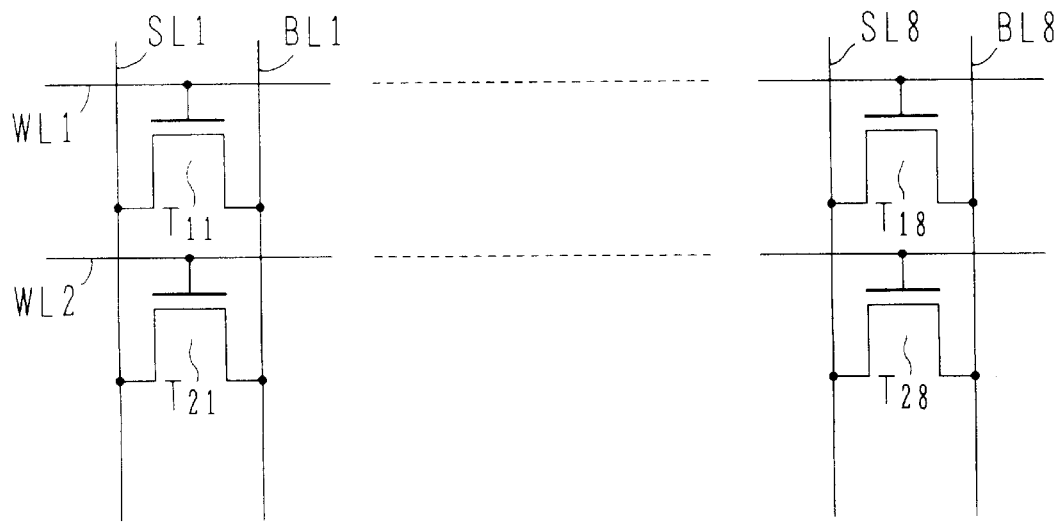

FIGS. 8A and 8B show examples of circuit structures of a mask ROM. FIG. 8A shows a NAND type mask ROM. MOS transistors $Q_{11}$ to $Q_{18}$ are serially connected between a source line SL1 and a bit line BL1. Similarly, MOS transistors $Q_{21}$ to $Q_{28}$ are serially connected between a source line SL2 and a bit line BL2. The gates of the MOS transistors $Q_{11}$, $Q_{21}$, ... are connected to a word line WL1. Similarly, the gates of the transistors at the same column are connected to the same word line.

Write data is stored in MOS transistors by selectively implanting impurity ions in their channels. A memory cell having data "0" is of a depletion or normally ON mode, and a memory cell having data "1" is of an enhancement or normally OFF mode. A low/high level signal is applied to the word line. A depletion mode transistor is always on independently from a potential on the word line. An enhancement mode transistor is on when the word line is high and off when it is low.

When a high level signal is applied to the word lines of all memory cells, all memory cells turn on. Under this condition, the word lines are sequentially driven by a low level signal one word line after another. If the corresponding memory cell is "0" (depletion mode), a bit Line current does not change. If it is "1" (enhancement mode), a bit line current changes.

FIG. 8B shows an example of the structure of a NOR type mask ROM. MOS transistors $T_{11}$, ..., $T_{18}$, $T_{21}$, ..., $T_{28}$ are disposed in a matrix. The gates of the transistors $T_{11}$, ..., $T_{18}$ on the same row are connected to the same word line WL1. The sources and drains of the transistors $T_{11}$, $T_{21}$, ... on the same column are connected to the same source line SL1 and bit line BL1, respectively.

The channel of each transistor is selectively implanted with impurity ions to set it to have a high threshold value HVth or a low threshold value LVth. A drive voltage applied to the word line has an intermediate potential between LVth and HVth.

When a predetermined voltage is applied across the source line SL and bit line BL and a drive voltage is sequentially applied to each word line, a bit line current corresponding to the threshold value of the corresponding memory cell is obtained.

Similar to the flash memory shown in FIG. 2, each memory cell block 1 of FIG. 7 is connected to a word line controller 2 and a bit line controller 3. A row address from an address circuit 33 is supplied to a row decoder 4 whose output is supplied to the word line controller 2 which generates a word line select signal. In this manner, the word line of the four memory cell blocks at the same row address is driven. Similarly, a column address from the address circuit 33 is supplied to a column decoder 5. In accordance with a column address signal CA, bit lines of the memory cell blocks 1a to 1d at the same column address are selected.

Data in a cell identified by the selected word line and bit line is read. The read data is output via a sense amplifier to a data correction circuit including an output change circuit 32 and a correction circuit 31.

The word select signal from the row decoder 4 and the bit line select signal from the column decoder 5 are also supplied to the parity cell block 6.

The parity cell block 6 has the same numbers of rows and columns as the memory cell blocks 1a to 1d. The word line select signal is input to the word line controller 7 to select the word line at the same row address as the memory cell blocks 1a to 1d. In accordance with the column address signal CA, bit lines having the same column address as the memory cell blocks 1a to 1d are selected.

Each memory cell of the parity cell block 6 stores parity data of the memory cell blocks 1a to 1d. If there is a defective memory cell, error data in the defective memory cell block can be recovered by using data read from the normal memory cell blocks and parity.

The parity cell block 6 stores EOR values of correct cell data in the cell blocks 1a to 1d at the same address, as parity data.

Parity data SP at the memory cell identified by the word line and bit line signals from the row decoder 4 and column decoder 5 is output from the parity cell block 6 to the data correction circuit 31.

The column address signal CA is also supplied to a defective output memory unit 10. An address of a defective memory cell detected by an operation test after manufacturing the mask ROM is being stored in the defective output memory unit 10.

An address of a defective cell is separated into a row and column address and a block address which are stored in a defective column and row address memory 34 and a defective block address memory 35. A row and column address from the address circuit 33 is compared with the defective row and column address from the defective address memory 34 by a comparison circuit 36. At the same time, the defective block address corresponding to the defective row and column address is supplied from the defective block address memory 35 to an output switch circuit 37. When the comparator circuit 36 detects that the row and column address from the address circuit 33 is the defective row and column address, a detect signal is supplied to the output switch circuit 37 which in turn supplies a defective block identifying signal SJ to the output switch circuit 32 and correction circuit 31.

Figure 9:
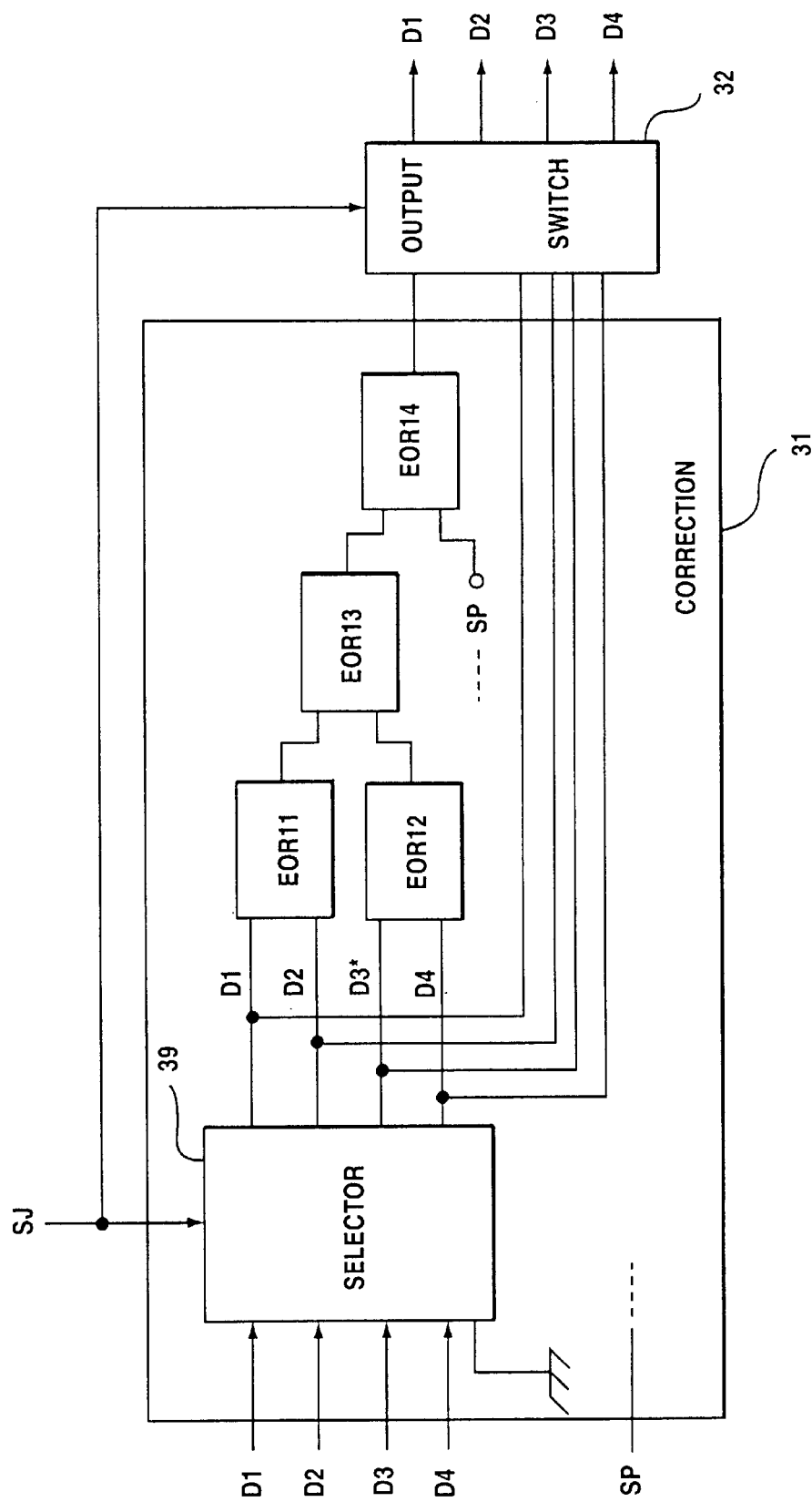
FIG. 9 is a circuit diagram showing the structure of a data correction circuit of one embodiment.

FIG. 9 shows an example of the structure of the correction circuit 31 and output switch circuit 32. The correction circuit 31 has a defective bit selector 39 and EOR gates EOR11 to EOR14. The selector 39 receives data D1 to D4 and the defective block identifying signal SJ supplied from the output switch circuit 37. The selector 39 is also supplied with an "0" input (ground signal).

It is assumed now that a memory cell in the memory block 1c is defective and the defective block identifying signal SJ identifies the data D3. In this case, the selector 39 receives the output switch signal SJ identifying D3. The selector 39 selects the "0" signal as data D3* in place of data D3, and inputs data D1, D2, D3*, and D4 to EOR 11 and EOR 12. EOR13 outputs an EOR value of the four input data. This EOR value and parity SP are used to obtain another EOR value at EOR14, and the obtained EOR value is supplied as a correct signal D3 to the output change circuit 32. Upon reception of the four signals D1, D2, D3*, and D4 supplied from the selector 39, output switch signal SJ, and correct signal D3, the output switch circuit 32 selects the correct signal D3 in place of D3* and outputs correct data D1 to D4.

If the output switch circuit 32 does not receive the output switch signal SJ, the read data D1 to D4 supplied from the correction circuit 31 is directly output therefrom. Instead of receiving the read data from the selector 39, the output switch circuit 32 may directly receive the read data D1 to D4 as shown by broken lines in FIG. 7.

In summary, a defective memory cell block of the mask ROM is detected by an operation test at the production delivery time. If there is a defective memory cell block among the four memory cell blocks 1a to 1d, the defective memory cell block information is stored in the defective output memory unit 10. The defective block can be detected for each address.

In a data read operation, in accordance with a row address RA and column address CA, cell data D1 to D4 and parity data SP respectively stored in the memory cell blocks 1a to 1d and parity cell block 6 at the same address are read and supplied to the data correction circuit 31, 32.

The data correction circuit 31, 32 operates by using the cell data D1 to D4, parity data SP, and defective memory block signal SJ. For example, assuming that the memory cell block 1a is defective, the data correction circuit 31, 32 uses the output signal from the correction circuit 31 instead of the cell data D1, and supplies it and other correct cell data D2 to D4 to output buffers 13a to 13d.

As a result, error cell data is corrected and correct data D1 to D4 are output.

In the above manner, if there is any defective memory cell block in the mask ROM, the data correction circuit 31, 32 automatically corrects error data by using the parity data stored in the parity cell block and the defective memory cell address information stored in the defective output memory unit 10.

Parity data stored in the parity cell block 6 is an EOR value of cell data to be stored in the memory cell blocks at the same address. The defective output memory unit 10 is sufficient only if it stores the address of a defective memory cell. It is therefore possible to reduce the capacity of the defective output memory unit 10 and shorten the time required for writing address data.

In the above embodiment, a mask ROM of a 4-bit structure has been used. A mask ROM of other structures such as a 2-bit structure and an 8-bit structure may also be used.

Figure 10:
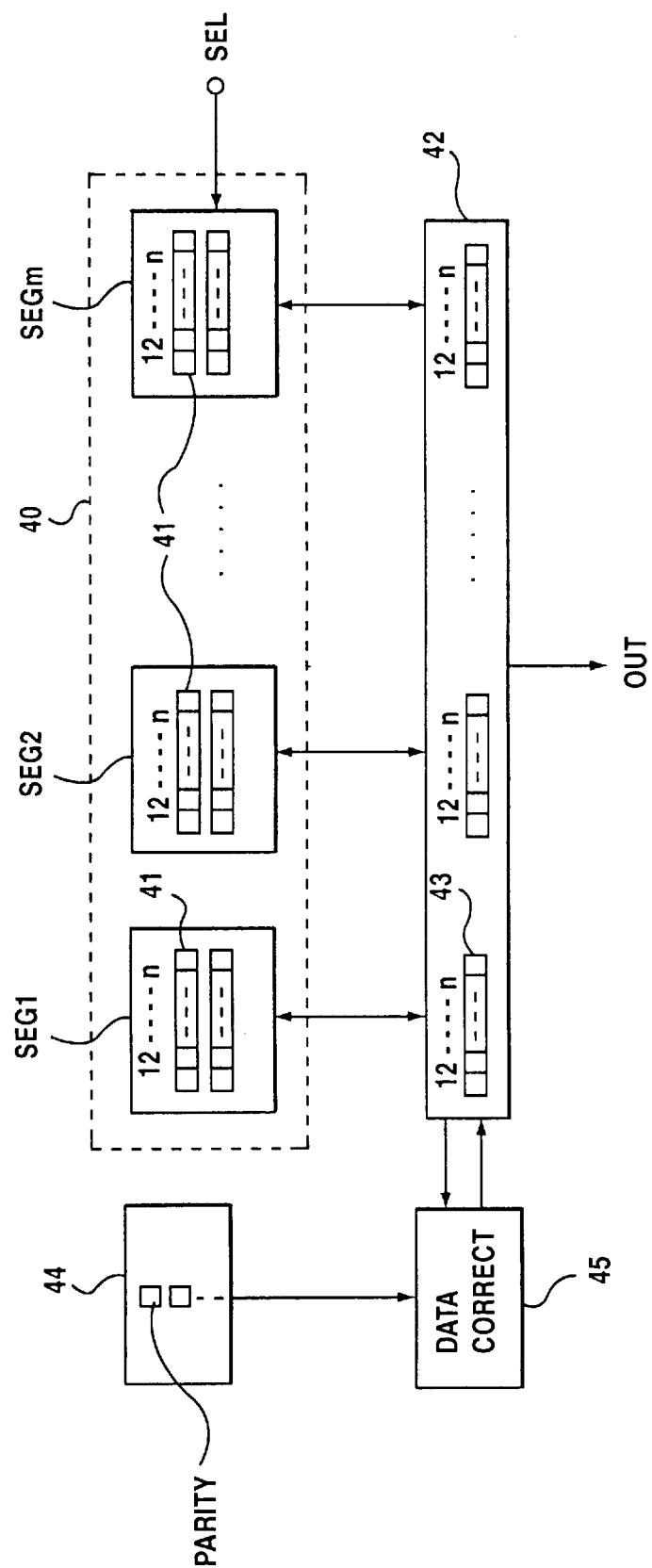
FIG. 10 is a block diagram showing a memory device according to another fundamental embodiment of the invention.

FIG. 10 shows the fundamental structure of a semiconductor memory device according to another embodiment of the invention.

A storage means 40 is constituted by m (m is an integer of 2 or larger) segments SEG1 to SEGm. Each segment SEGi has a plurality of storage areas 41 each storing n-bit data. One of the plurality of storage areas 41 of each segment SEGi is identified by a storage area selection signal SEL externally input.

A buffer memory 42 is connected to the storage means 40, the buffer memory 42 having m storage areas 43 each storing n-bit data. Each of the m storage areas 43 of the buffer memory 42 corresponds to each of the segments SEG1 to SEGm. Data is transferred between each storage area 43 and a storage area 41 of the corresponding segment SEGi.

A parity storage means 44 is provided which stores one parity per (n×m)-bit data stored in m storage areas 41 selected from each of the m segments by storage area selection signal SEL. One of a plurality of parities stored in the parity storage means 44 is identified by the storage area selection signal SEL.

A data correcting means 45 stores the information for identifying one defective bit among the (n×m)-bit data selected from the m segments by the storage area selection signal SEL. The data correcting means 45 corrects the defective bit in accordance with the (n×m−1)-bit data excepting the defective bit among the (n×m)-bit data stored in the buffer memory 42 and corresponding one parity stored in the parity storage means 44.

The n bit data corresponding to one segment among the (n×m)-bit data generated by correcting the defective bit is output to the external.

Another embodiment of the present invention will be described by using as an example a semiconductor memory device for storing data in the unit of two-bit.

Figure 11:
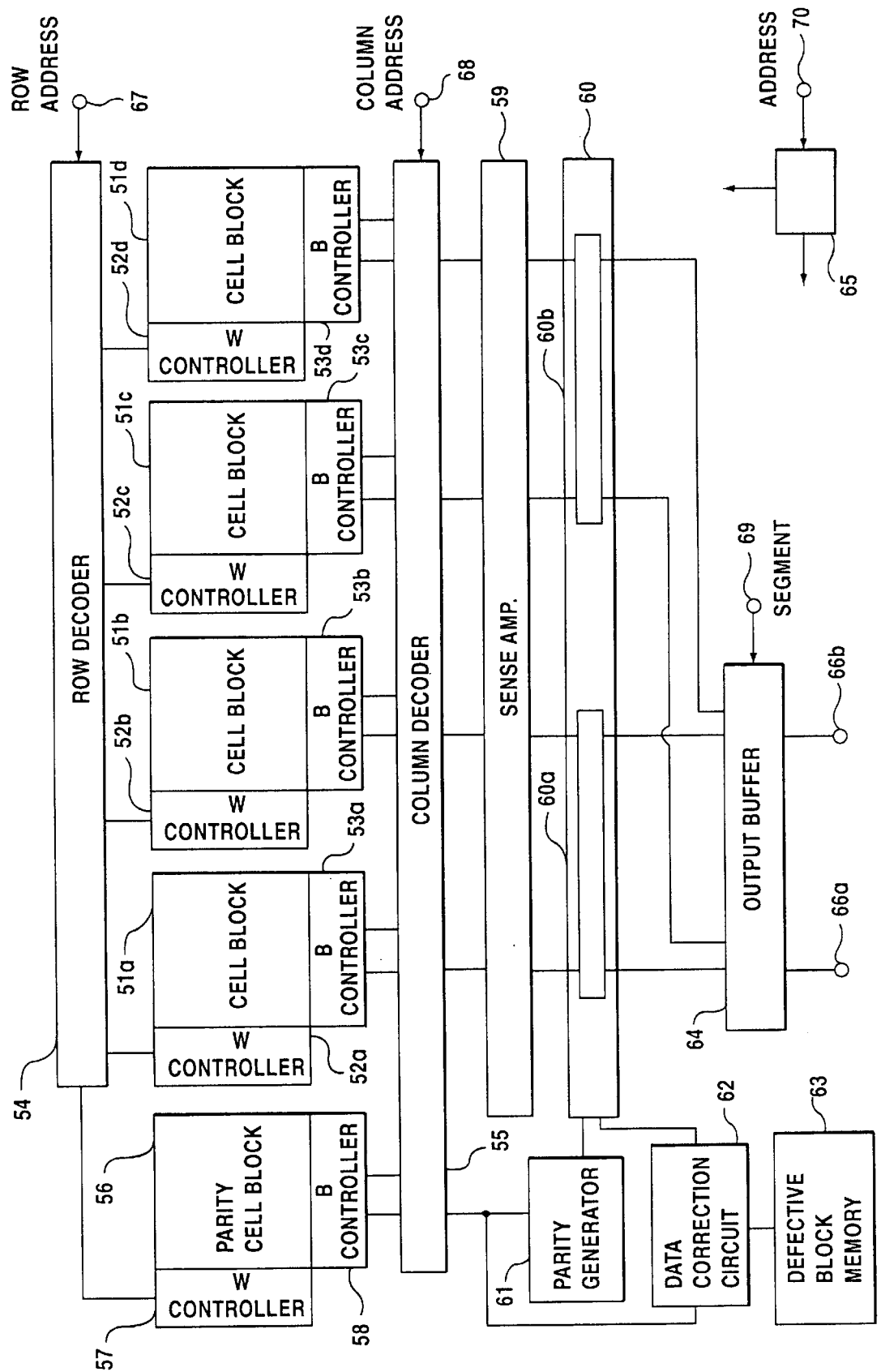
FIG. 11 is a circuit block diagram showing the structure of a flash memory according to another embodiment of the invention.

FIG. 11 is a block diagram showing a semiconductor memory device of this embodiment. Cell blocks 51*a* to 51*d* each have a plurality of cells disposed in a matrix shape cell, a word control circuit 52*a* to 52*d* for row selection control, and a bit control circuit 53*a* to 53*d* for column selection control. Each cell of the cell block 51*a* to 51*d* stores one-bit data. The structure of each cell block is the same as the cell block 1*a* to 1*d* shown in FIG. 1.

One segment is constituted by the cell blocks 51*a* and 51*b*, and another segment is constituted by the cell blocks 51*c* and 51*d*. Each segment stores two-bit data.

A row decoder 54 is connected to a word control circuit 52 of each cell block 51. The row decoder 54 receives a row address signal from a terminal 67 and decodes it. The decoded results are sent to the word control circuit 52 to select one word line of each cell block 51.

A column decoder 55 is connected to a bit control circuit 53. The column decoder 55 receives a column address signal from a terminal 68 and decodes it. The decoded results are sent to the bit control circuit 53 to select one bit line of each cell block 51.

A buffer memory 60 is connected to the bit control circuit 53 of each cell block via a sense amplifier 59 and the column decoder 55. The buffer memory 60 has a two-bit storage area 60*a* corresponding to the cell blocks 51*a* and 51*b* and a two-bit storage area 60*b* corresponding to the cell blocks 51*c* and 51*d*, and stores 4-bit data in total. Namely, the buffer memory has a storage area for storing one unit of two-bit data for respective segments.

During a read operation, data stored in a cell selected by the row and column address signals is transferred to the buffer memory 60 via the column decoder 55 and sense amplifier 59. During a write operation, data stored in the buffer memory 60 is written into the cell selected via the sense amplifier and column decoder 55.

An out buffer (input/output control means) 64 connects the buffer memory 60 to input/output terminals 66*a* and 66*b*. In accordance with a segment selection signal input from a terminal 69, the out buffer 64 selects one of the storage areas 60*a* and 60*b* of the buffer memory 60 for the data transfer between the selected storage area and the output terminals 66*a* and 66*b*.

An address distribution circuit 65 is connected to terminals 67, 68, and 69. In accordance with an address signal input from a terminal 70, the address distribution circuit 65 generates the row address signal, column address signal, and segment selection signal.

A parity cell block 56 is provided which has the same structure as the cell block 51. A word control circuit 57 of the parity cell block 56 is connected to the row decoder 54 and controlled by the row decoder 54, whereas a bit control circuit 58 is connected to the column decoder 55 and controlled by the column decoder 55.

A parity generator 61 is connected to the buffer memory 60. The parity generator 61 generates a parity in accordance with an EOR of each bit of the four-bit data stored in the buffer memory 60 and writes it into the selected cell of the parity block 56.

A data correction circuit 62 is connected to the column decoder 55 and buffer memory 60. A defective cell block storage circuit 63 is connected to the data correction circuit 62. The defective block storage circuit 63 stores defective block data for identifying a defective cell block, if any one of the cell blocks 51*a* to 51*d* is defective.

A parity stored in the selected cell of the parity cell block 56 is read by the data correction circuit 62 via the column decoder 55. The data correction circuit 62 obtains an EOR of four bits in total, including three-bit data excepting the bit corresponding to the defective cell block among the four-bit data stored in the buffer memory 60 and one parity bit read from the parity cell block 56.

Next, a write operation of the semiconductor memory device shown in FIG. 11 will be described.

An address signal for selecting the cell blocks 51*a* and 51*b* is applied to the terminal 70, and the write data is applied to the terminals 66*a* and 66*b*. The address distribution circuit 65 sends a segment selection signal for selecting the cell blocks 51*a* and 51*b* to the terminal 69 and sends a row address signal and a column address signal to the terminals 67 and 68 respectively. The out buffer 64 writes the data applied to the terminals 66*a* and 66*b* into the storage area 60*a* of the buffer memory 60.

Next, an address signal, which changes only the segment selection signal to select the cell blocks 51*c* and 51*d* and does not change the row address signal and column address signal, is applied to the terminal 70, and the write data is applied to the terminals 66*a* and 66*b*. The address distribution circuit 65 sends the segment selection signal for selecting the cell blocks 51*c* and 51*d* to the terminal 69 and also sends the row address signal and column address signal to the terminals 67 and 68. The out buffer 64 writes the data applied to the terminals 66*a* and 66*b* into the storage area 60*b* of the buffer memory 60.

The parity generator 61 generates a parity for the four-bit data stored in the buffer memory 60. At the same time when the four-bit data stored in the buffer memory 60 is written into the selected cells of the cell blocks 51*a* to 51*d*, the parity generated by the parity generator 61 is written into the selected cell of the parity cell block 56. The data write process for the defective cell block is not necessary to be executed.

Next, a read operation of the semiconductor memory device shown in FIG. 11 will be described by taking as an example reading two-bit data stored in the segment constituted by the cell blocks 51*a* and 51*b*.

An address signal corresponding to read addresses is applied to the terminal 70. The address signal distribution circuit 65 sends a segment selection signal for selecting the cell blocks 51*a* and 51*b* to the terminal 69 and also sends the row address signal and column address signal corresponding to read addresses to the terminals 67 and 68 respectively.

Not only the data in the selected cells of the cell blocks 51*a* and 51*b* but also the data in the selected cells of the cell blocks 51*c* and 51*d* are read by the buffer memory 60. At the same time, the parity stored in the selected cell of the parity cell block 56 is read by the data correction circuit 62.

The data correction circuit 62 reproduces data of the defective cell block, in accordance with the parity bit read from the parity cell block 56 and three bits excepting the bit corresponding to the defective cell block. The defective cell block is indicated by the defective block data stored in the defective cell block storage circuit 13. The reproduced data is written into the corresponding bit of the buffer memory 60. The out buffer 64 outputs the data stored in the storage area 60a of the buffer memory 60 to the input/output terminals 66a and 66b.

Similarly, in reading data from the segment constituted by the cell blocks 51c and 51d, two-bit data in the segment is read to reproduce the data in the defective block in accordance with the four-bit data.

As described above, with the redundancy structure shown in FIG. 10, in the case that data is stored in the unit of two-bit, one parity bit per four bits is stored. As compared to storing one bit parity per two bits, the storage capacity of parities can be halved.

In the above embodiments, the memory space is divided into two segments. Three or more segments may be used. For example, if data is stored in the unit of two-bit and the memory space is divided into sixteen segments, one parity per thirty two bits is stored. The more the number of divided segments is increased, the more efficiently the redundancy control can be performed.

In the above embodiments, data is stored in the unit of two-bit. The number of bits in one unit is not limited to two. For example, the number of bits in one unit may be one bit, four bits, eight bits, sixteen bits, thirty two bits, or the like.

Representing the number of bits in one unit by n and the number of divided segments by m, combinations (n, m) for n×m=32 are (1, 32), (2, 16), (4, 8), (8, 4), and (16, 2). In this case, thirty two cell blocks 51 are used and the number of bits of the buffer memory 60 is set to thirty two. By changing the configuration of only the out buffer 64, the number of bits in one unit can be changed.

In the above embodiments, a flash memory is used by way of example. The embodiments are applicable to other memories such as a programmable ROM unable to be erased if data is once written and an EPROM able to erase by application of ultraviolet rays or the like.

The present invention has been described in connection with the preferred embodiments. The invention is not limited only to the above embodiments. For example, any one of the error correction circuits shown in FIGS. 6 and 9 may be used interchangeably. The structure of a memory array is not limited only to the embodiment structures. It is apparent to those skilled in the art that various modifications, substitutions, improvements, combinations and the like can be made without departing from the scope of the appended claims.

I claim:

1. A semiconductor memory device comprising:

storage means having m (m is an integer of 2 or larger) segments, each segment having a plurality of storage areas, each storage area storing data of n-bit (n is a natural number), one of the plurality of storage areas in each segment being selected by a storage area selection signal externally input;

a buffer memory having an (n×m)-bit storage area for storing n-bit for each of the m segments of said storage means, data being adapted to be transferred between the storage area of each segment and a corresponding storage area of said buffer memory;

parity storage means having a storage area, corresponding to the storage area of each segment of said storage means, for storing one parity per (n×m)-bit data stored in m storage areas, each of the m storage areas being selected from each of the m segments of said storage means; and data correction means for correcting data in accordance with a parity stored in said parity storage means and the (n×m)-bit data read from the m storage areas, each selected from each of the m segments of said storage means; and input/output control means for transferring data between an external circuit and the storage area of n-bit corresponding to a segment identified by an input segment selection signal among the (n×m)-bit storage area of said buffer memory.

2. A semiconductor memory device according to claim 1, wherein said storage means includes n×m cell blocks each having a plurality of cells each storing one-bit data, each cell block corresponding to one bit of said buffer memory, and one cell in each cell block being identified by the storage area selection signal.

3. A semiconductor memory device according to claim 2, wherein said data correction means includes defective cell block storage means for storing a defective block data, if there is any defective cell block among the n×m cell blocks, the defective block data indicating the defective cell block.

4. A semiconductor memory device according to claim 3, wherein said data correction means reproduces data of the defective cell block in accordance with the parity stored in said parity storage means and (n×m−1)-bit data excepting the bit corresponding to the defective cell block indicated by the defective cell block storage means among the (n×m)-bit data stored in said buffer memory.

5. A semiconductor memory device according to claim 1 further comprising: parity generating means for generating a parity in accordance with the (n×m)-bit data stored in said buffer memory and write the generated parity into the parity storage means.

6. A semiconductor memory device according to claim 1, wherein said storage means includes n×m cell blocks each having a plurality of cells each storing one-bit data, each cell block corresponding to one bit of said buffer memory, and one cell in each cell block being identified by the storage area selection signal.

7. A semiconductor memory device according to claim 6, wherein said data correction means includes defective cell block storage means for storing a defective block data, if there is any defective cell block among the n×m cell blocks, the defective block data indicating the defective cell block.

8. A semiconductor memory device according to claim 7, wherein said data correction means reproduces data of the defective cell block in accordance with the parity stored in said parity storage means and (n×m−1)-bit data excepting the bit corresponding to the defective cell block indicated by the defective cell block storage means among the (n×m)-bit data stored in said buffer memory.

* * * * *